(12) United States Patent
Boersema

(10) Patent No.: US 8,844,220 B2
(45) Date of Patent: Sep. 30, 2014

(54) COMPUTER ROOM

(75) Inventor: Kornelis Hendrik Boersema, Amersfoort (NL)

(73) Assignee: Boersema Installatie-Adviseurs B.V., Amersfoort (NL)

( * ) Notice: Subject to any disclaimer, the term of this patent is extended or adjusted under 35 U.S.C. 154(b) by 252 days.

(21) Appl. No.: 13/120,940

(22) PCT Filed: Sep. 18, 2009

(86) PCT No.: PCT/NL2009/050558
§ 371 (c)(1),
(2), (4) Date: Jun. 10, 2011

(87) PCT Pub. No.: WO2010/036106
PCT Pub. Date: Apr. 1, 2010

(65) Prior Publication Data
US 2011/0232209 A1    Sep. 29, 2011

(30) Foreign Application Priority Data

Sep. 25, 2008 (NL) ...................................... 1035984

(51) Int. Cl.
*E04B 7/18* (2006.01)
*E04G 15/06* (2006.01)
*E04C 2/52* (2006.01)
*H05K 7/20* (2006.01)
*F24F 11/00* (2006.01)
*F24F 7/00* (2006.01)

(52) U.S. Cl.
CPC ....... *H05K 7/20745* (2013.01); *F24F 2007/004* (2013.01); *F24F 11/0001* (2013.01)

USPC ............................. 52/220.1; 52/198; 52/219

(58) Field of Classification Search
USPC .................. 52/302.1, 173.1, 219, 198, 220.1; 454/184, 250
See application file for complete search history.

(56) References Cited

U.S. PATENT DOCUMENTS

| 1,749,343 | A | * | 3/1930 | Hersh ........................... 454/250 |
| 2,601,819 | A | * | 7/1952 | Redford ........................ 454/339 |
| 4,295,415 | A | * | 10/1981 | Schneider, Jr. ............... 454/185 |
| 4,498,526 | A | * | 2/1985 | Arenas ........................... 165/45 |
| 5,468,184 | A | * | 11/1995 | Collier ......................... 454/186 |
| 6,225,705 | B1 | | 5/2001 | Nakamats |
| 7,643,291 | B2 | * | 1/2010 | Mallia et al. ................. 361/695 |

(Continued)

FOREIGN PATENT DOCUMENTS

| JP | S62186147 A1 | 8/1987 |
| WO | 2006/124240 A | 11/2006 |
| WO | 2007/054578 A | 5/2007 |

*Primary Examiner* — Elizabeth A Plummer
(74) *Attorney, Agent, or Firm* — Wood, Phillips, Katz, Clark & Mortimer

(57) ABSTRACT

The present invention relates to a computer room which is surrounded by a lower floor, at least one side wall and a roof, with an air-permeating load-bearing floor disposed above the lower floor, on which, in use, computer equipment is disposed. A separation arrangement provides for the separation from each other of a riser channel for hot air above the computer equipment on the one hand and a return channel for air being carried back from the top of the computer room to the space under the load-bearing floor on the other hand. The surface area of the return channel of a cross-section of the computer room amounts to at least 5% of the surface area of the riser channel of the same cross-section.

25 Claims, 1 Drawing Sheet

(56) References Cited

U.S. PATENT DOCUMENTS

| | | | |
|---|---|---|---|
| 2003/0209023 A1* | 11/2003 | Spinazzola et al. | 62/259.2 |
| 2005/0225936 A1* | 10/2005 | Day | 361/687 |
| 2006/0068695 A1 | 3/2006 | Kelley et al. | |
| 2006/0168975 A1 | 8/2006 | Malone et al. | |
| 2007/0135032 A1 | 6/2007 | Wang | |
| 2009/0073652 A1* | 3/2009 | Matser et al. | 361/691 |
| 2009/0168345 A1* | 7/2009 | Martini | 361/691 |
| 2009/0308579 A1* | 12/2009 | Johnson et al. | 165/104.34 |
| 2010/0190430 A1* | 7/2010 | Rodriguez et al. | 454/184 |
| 2011/0009047 A1* | 1/2011 | Noteboom et al. | 454/184 |
| 2011/0105010 A1* | 5/2011 | Day | 454/184 |
| 2011/0138708 A1* | 6/2011 | Chazelle et al. | 52/173.1 |
| 2011/0214364 A1* | 9/2011 | Fuller | 52/173.3 |
| 2012/0014061 A1* | 1/2012 | Slessman | 361/691 |
| 2012/0309284 A1* | 12/2012 | Dernis et al. | 454/184 |

* cited by examiner

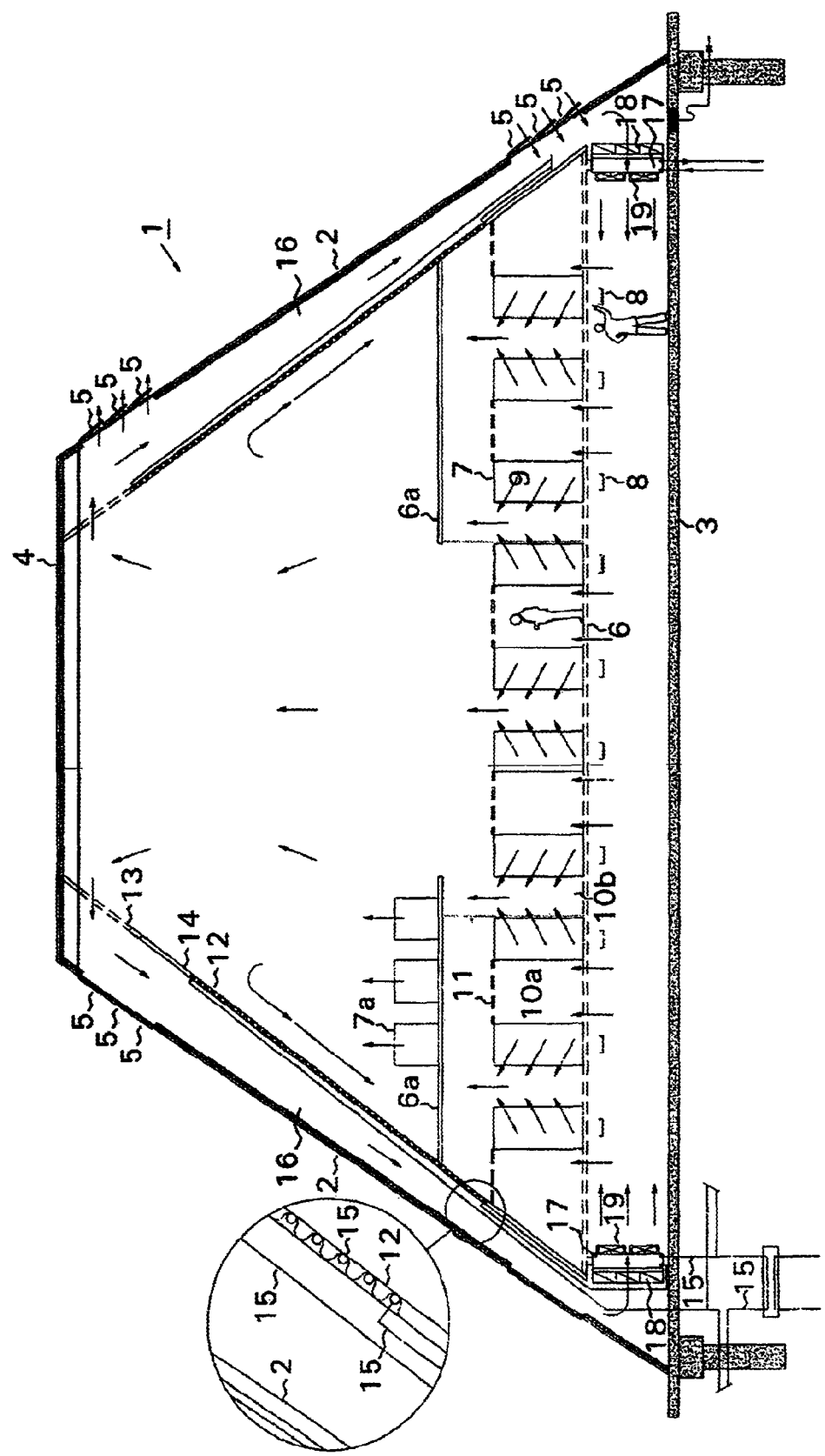

COMPUTER ROOM

TECHNICAL FIELD

The present invention, according to a first aspect thereof, relates to a computer room surrounded by a lower floor, at least one side wall and a roof, further comprising a climate control device and an air-permeating load-bearing floor disposed above the lower floor, on which load-bearing floor, in use, computer equipment is disposed. The roof need not be a separate roof, it may also be formed in that the side wall or side walls converge, as in the case of an igloo or a pyramid, respectively.

BACKGROUND

Such computer rooms are known as data centres. In the room, a mechanical air circulation is generated for cooling the computer equipment, with fans blowing air that has been exhausted at the top of the room and subsequently cooled into the space between the lower floor and the load-bearing floor. The load-bearing floor is to that end disposed about 30 cm above the lower floor. In order to generate a substantially uniform distribution of the air flow through the load-bearing floor in its entirety, the floor has an air resistance, also called authority, which prevents the inblown air from being largely blown through the load-bearing floor at locations close to the locations were the air is blown into the space below the load-bearing floor, as a consequence of which relatively little air would flow up through the load-bearing floor at locations further removed from the aforesaid locations. Over the years, computer equipment has become ever more compact while emitting more and more heat. As a result, it has become increasingly necessary to cool the air so as to provide sufficient cooling capacity. A drawback of the known devices is that they consume a great deal of energy, not only for driving the computer equipment but also for controlling the climate in the computer room.

SUMMARY OF THE INVENTION

Accordingly it is an object of the present invention, according to a first aspect thereof, to provide a computer room in which the conditions are created for a situation in which the computer equipment can be cooled to a sufficient extent whilst less energy is consumed than in a prior art computer room comprising a comparable amount of computer equipment. The present inventor has recognized that powerful mechanical ventilation is required for providing the air flow, because the air encounters a great deal of resistance while circulating, and that reducing said resistance will reduce the need to support the circulation of the air by mechanical means. The object aimed at is accomplished by the present invention in that separation means are provided for the separation from each other of a riser channel for hot air above the computer equipment on the one hand and a return channel for air being carried back from the top of the computer room to the space under the load-bearing floor on the other hand, with the surface area of the return channel of a horizontal cross-section of the computer room amounting to at least 5% of the surface area of the riser channel of the same cross-section. In addition to the aforesaid reduction of the authority of the load-bearing floor, additional measures may be required in order to provide an adequate distribution of air between the lower floor and the load-bearing floor. Examples of such measures will be given hereinafter. As a result of the characteristic features mentioned herein, the air circulation can take place at a low speed, and hardly any resistance, if at all, needs to be overcome. Thus, conditions have been created for a circulation based on natural draught generated by the column of rising air above the hot computer equipment. Said draught may be mechanically supported, if desired, but in that case very little energy will be required for that purpose. The idea underlying the invention is that a reduction of the resistance in the air flow requires a reduced rate of flow. A reduced rate of flow in itself will result in a reduced resistance. Eventually the rate of flow and the resistance can be reduced to a minimum until the air speed is for example 1-2 m/s along at least substantially the entire route.

For the purpose of illustration it can be noted here that in large computer centres typically 33% of the total energy consumption is related to controlling the interior climate. Said 33% are typically divided into 25% for cooling, 7% for circulating the air and 1% for other purposes. Using the device according to the present invention it is possible to save more than 80%, in the case of entirely natural ventilation even up to 100%, on energy for air circulation. The saving on energy for cooling air depends on the outside climate at the location of the computer centre. In countries with a relatively cool climate said saving will be higher than in countries with a relatively hot climate.

In order to be able to cool the computer equipment with outside air, it is preferable if at least one air inlet and at least one air outlet are provided. The air outlet is preferably located higher in the computer room than the air inlet. The advantage of cooling the computer equipment with outside air is that the air heated by the computer equipment need not be re-cooled before being reused for cooling the computer equipment in a next cycle. In the present preferred embodiment the air inlet is located 2 m above the ground level and the air outlet is located at the top of said at least one side wall. As a result, outside air can flow between the lower floor and the load-bearing floor through said at least one air inlet in the computer room and subsequently be led past the computer equipment and, thus heated, exit the computer room via said at least one air outlet. It will be understood that such a device, providing the outside temperature is low enough, consumes less energy than a known device, in which the air is recirculated and needs to be cooled with each new cycle. This, too, makes it possible to realise a saving of up to 100% on energy for cooling air.

In a preferred embodiment of the present invention, the surface area of the return channel amounts to at least 10% of the surface area of the riser channel, more preferably more than 20%. The larger the surface area of the return channel in relation to the surface area of the riser channel, the further the rate of flow of the air can be reduced.

The cross-sectional area between the separation means and the side wall is preferably at least substantially constant along a significant part of the height. As a result, the capacity of the air flow channel formed between the separation means and the side wall is substantially constant, ensuring an unaffected air flow, making it possible, in combination with the low rate of flow, to realise a low flow resistance.

In a preferred embodiment of the present invention, cooling means are provided in the separation means. The cooling means may be configured in the form of at least one coolant line. The cooling means can be used for cooling air that flows upwards from the computer equipment and comes into contact with the separation means. Thus, a downward air flow is generated also on the inner side of the separation means, which air flow can again be led past computer equipment which is less temperature-sensitive. As a result, the air that has been heated by the computer equipment and subsequently partially cooled by the separation means is further heated.

This enhances the chimney effect and thus the draught of (cool) air through the computer equipment, so that even less energy will be required for displacing air inside the computer room. It stands to reason that the cooling of the separation means also results in the air in the air channel between the separation means and the at least one side wall cooling down further, as a result of which it will fall more quickly, which likewise contributes towards improving the air flow.

If the air resistance of the load-bearing floor is less than 3 Pa, preferably 2 Pa, more preferably 1 Pa, the air that flows through the load-bearing floor will encounter hardly any resistance from the load-bearing floor. With such a low air resistance, sufficient air can be circulated in the computer room, purely through natural draught, for cooling the equipment disposed in the computer room. It is preferable in that case if the load-bearing floor is a grid floor.

To realise a sufficient resistance-free flow under the load-bearing floor it is preferable if the load-bearing floor is disposed at least 0.6 m, more preferably 1 m, above the lower floor. On account of the relatively low resistance realised as a result of the relatively wide flow channel between the lower floor and the load-bearing floor, the air can readily spread in the space between the load-bearing floor and the lower floor to realise an at least substantially uniform distribution of the air flow under the load-bearing floor. In fact, the air can spread dependently of the demand from the computer equipment disposed on the load-bearing floor.

If the load-bearing floor is disposed at least 1.80 m above the lower floor, preferably at least 2.10 m, working space for personnel is provided. The working space can be used for laying cables from and to the computer equipment under the load-bearing floor. In addition, ducts may be mounted under the load-bearing floor, through which ducts cables can be passed. This enhances the accessibility to personnel of the computer equipment on the load-bearing floor when adjustments are to be made to systems and the associated cabling.

If a further load-bearing floor is provided at a higher level than the load-bearing floor, computer equipment which is less sensitive to heat can be disposed on said further load-bearing floor. Thus, the air flowing through the computer equipment can be heated even further. This leads to an improved natural draught, since a greater pressure difference is available.

In a preferred embodiment of the present invention, said one side wall extends upwards at an angle to the vertical. If a kind of dome is thus realised, one side wall will suffice. If a computer room having a polygonal base is used, three or more side walls will be provided, depending on the number of corners, which side walls extend upward in a converging manner from said polygonal base. It will be understood that if a converging shape of the side wall(s) is used, the spacing between the separation means and said at least one outer wall preferably decreases in a direction from the top towards the bottom. As a result, relatively more space is available at the level of the load-bearing floor for placing computer equipment than in the situation in which a constant spacing is used between the separation means and the at least one outer wall.

To provide sufficient space for generating the chimney effect it is preferable if the roof of the computer room is disposed at least 8 m above the air inlet. This provides space for the air to rise above the computer equipment and contributes towards generating an air draught through the room. If the roof is disposed 10 or even 12 m above the load-bearing floor, the chimney effect will be enhanced even further.

In a preferred embodiment of the present invention, air cooling means are provided for cooling the air. Besides, or instead of, the previously discussed coolant line in the separation means, air cooling means can be disposed in the path of heated air from the computer equipment to the space between the lower floor and the load-bearing floor. Also if the computer room comprises an air inlet and an air outlet, as described before, the presence of air cooling means may be desirable for situations in which the outside air that can flow into the computer room through the air inlet is (too) hot to provide sufficient cooling capacity or for falling back on mechanical ventilation if the outside air conditions render it undesirable to use said outside air.

Furthermore, filter means may be provided for filtering air before it flows through the computer equipment. In particular if air from outside the building is drawn in, it is important that the air be filtered so as to prevent the computer equipment being contaminated by impurities in the air flow.

It is possible to provide means for recovering and storing energy from the air heated by the computer equipment. This makes it possible not only to realise a reduction of the energy consumption, but also to store energy that can be resold to third parties.

The present invention further relates to a computer centre comprising two or more substantially separated computer rooms as discussed above. There is an ever increasing demand for concentrated computer capacity, and in order to meet this demand, computer centres are being extended further and further. For security reasons, for example, it may be desirable to build up a computer centre in the form of a number of mutually separated computer rooms.

BRIEF DESCRIPTION OF THE DRAWING

FIG. 1 is a diagrammatic, vertical sectional view of a computer room embodying the principles of the present invention.

The present invention will now be explained in more detail with reference to the appended FIGURE, in which a preferred embodiment of the present invention is shown, merely by way of example, in vertical sectional view.

DETAILED DESCRIPTION OF THE DRAWING

The appended FIGURE schematically shows a vertical sectional view of a preferred embodiment of a compartment of a computer centre, hereinafter called computer room 1, according to the present invention. The computer room 1 has four sloping walls 2, which extend from a bottom 3 in the form of an insulated floor at ground level to a roof 4. Windows 5 are provided in the upper side of the walls 2, which windows can be opened in various positions, as desired, or be closed. Windows 5 to be opened in various positions and closed are also provided in the walls 2 at the bottom side of said walls 2.

Positioned about 2 m above the bottom 3 is a load-bearing floor 6 formed of grid floor panels (not shown) as known per se, on which racks 7 with computer equipment are disposed. Cable ducts 8 are suspended under the load-bearing floor 6. The computer equipment comprises internal fans 9. So-called cold passages 10a and so-called hot passages 10b are alternately present between adjacent racks. A ceiling 11 is provided above a cold passage 10a, but this is not necessary.

Inside the computer room 1, inner walls 12 extend towards the roof 4 beside the side walls 2. At the location of the windows 5, the inner walls are provided with openings 13 and glass strips 14, which face towards the north as much as possible. The inner walls 12 are made up of sandwich elements, through which coolant lines 15 extend (see inset). The coolant lines 15 extend from low-resistance coolers 17 to the inner wall 12, through which they extend upward in a winding fashion to a heat exchanger (not shown). Thus, air channels 16 are formed between the side walls 2 and the respective inner walls 12. The air channels 16 become narrower in downward direction, but because they extend in downward direction over a wall that becomes increasingly wider, the total surface area of a horizontal cross-section of the air channels 16 in the computer room 1 remains constant.

Near the side wall 2, low-resistance coolers 17, low-resistance filters 18 and fans 19 are disposed between the bottom 3 and the load-bearing floor 6. The coolers 17 are connected to a combination (not shown) of underground energy storage means and cooling machines and means for supplying heat to third parties.

In the FIGURE, arrows indicate partial air flows as generated in a data centre according to the present invention and explained herein. On the right-hand side a situation is shown in which air flows in through windows 5 at the bottom of the computer room 1 and out through windows through windows 5 at the top of the computer room 1. Where necessary, air is partially recirculated between the side wall 2 and the inner wall 12. On the left-hand side of the FIGURE an air flow is shown in a situation in which full recirculation takes place.

The cooling of a computer room according to the present invention can take place by means of 100% natural ventilation, by means of a closed system with recirculation of the air and by means of a combination of these two extremes. The selection of a cooling method may be based on the temperature, humidity or purity of the outside air and can be changed at any moment, at least in this embodiment comprising windows that can be opened. The two extremes, 100% natural ventilation and 100% recirculation, will be discussed hereinafter. To support the cooling, moisture can be vaporised between the outer wall and the separation means, which vaporised moisture can provide adiabatic cooling or moisturisation of the air.

From the viewpoint of energy consumption, the method of 100% natural ventilation is preferred for cooling the computer room 1, said method being suitable in particular for use in countries not having a very hot climate. The windows 5 are open. At the bottom of the wall 2, outside air is allowed into the computer room 1 through the windows 5. The outside air is cooler than the air in the computer room 1 and will consequently "fall" down and spread across the bottom 3. Upon flowing down, the air will pass through low-resistance filters 18. The air can properly spread over the bottom because the load-bearing floor 6 is disposed relatively high above the bottom 3, unlike the situation in known computer centres. Heat generated by the computer equipment in the racks 7 is absorbed by air present in the vicinity of the equipment (in the racks). As a result of said heating, the air will rise and air will be drawn in from the space between the load-bearing floor 6 and the bottom 3 through the open grids of the load-bearing floor 6. Said air is subsequently heated as well, and will in turn rise. This process will go on continuously, of course.

The racks 7 are fitted with internal fans, which direct the rising air away from a cold passage 10a to a hot passage 10b. In fact, the flow pattern of the air determines which passage is a hot passage and which passage is a cold passage. In the FIGURES, ceilings 11 are installed above the cold passages 10a. In prior art computer centres, such ceilings prevent air that has been heated by the computer equipment from being drawn in again by the internal fans of the computer equipment at the rear side via the cold passage before it can rise above the racks. After all, because of the authority of the prior art load-bearing floor, air can be sucked in more easily from above the racks than through the load-bearing floor. With computer centres according to the present invention this risk is smaller or even excluded altogether, because the floor does not have an authority. The rising air will eventually escape through the open windows 5 at the top of the walls 2.

The computer room 1 is thus cooled entirely in a natural manner, using natural air, and no energy is used for cooling the air. It is conceivable for a computer room 1 to be cooled by means of 100% natural cooling at all times. In that case it would not be necessary to provide cooling devices or fans in the computer room. In practice, however, mechanical ventilation and cooling will often be provided for emergencies, but such "spare capacity" is also required in the case of mechanically ventilated computer rooms. It will furthermore be understood that it is desirable in the case of 100% natural ventilation that the air will encounter little resistance when flowing along the above-described path.

There may be valid reasons why natural cooling is not possible or undesirable. They may be related to an (overly) high/low outside temperature, an (overly) low air humidity, too much pollution in the air or to other factors. In that case the computer room can be cooled on the basis of 100% recirculation. The windows will remain closed in that case. Hot air is carried from the top of the computer room 1 between the side walls 2 and the inner walls 12 in the direction of the space between the bottom 3 and the load-bearing floor 6. Fans 19 are to that end provided, which fans, complementary to the thermal draft and depending on the embodiment that is used, draw in air from the air channel 16 and which can blow said air under the load-bearing floor 6. Air is primarily cooled by carrying the air through the coolers 17 disposed on the side of the bottom 3. The air is already pre-cooled in that the air flow is first partially brought into contact with the inner walls 13, through which coolant lines 15 extend.

The cooled air flows under the load-bearing floor 6 and will rise through the load-bearing floor 6 not only as a result of natural draught but also as a result of a pressure difference generated by the fans 19. While rising, the air will flow through the racks 7 again, where the air is heated by the computer equipment, flowing through the internal fans 9, if provided, to a hot passage 10b and subsequently rising further in the computer room 1. In the centre of the computer room, the air will rise straight up to the roof 4. The hot air that rises on the sides of the computer room 1 will come into contact with the inner walls 12, which are cooled by means of the coolant lines 15. As a result, said air will be slightly cooled. The air that comes into contact with an inner wall 12 will cool down and will rise less quickly and subsequently even flow downward. Subsequently, the air is led to the centre of the of the computer room 1 again. The air will have cooled down at that stage, to be true, but it will still have a temperature higher than the air that is led through the load-bearing floor 6 to the computer equipment in the lower racks 7. Computer equipment positioned in the racks 7a on the load-bearing floor 6a, which is positioned above the racks 7 on the load-bearing floor 6, will further heat the air to a temperature higher than that of the air which has flown from the load-bearing floor through the computer equipment only once. The result is that the air will rise more quickly and will be hotter at the top of the computer room 1 than in the situation in which part of the air is not carried via a subflow through the equipment a second time by the cooled inner wall.

In a computer room with 100% mechanical cooling and recirculation, no air inlets and outlets are needed. It is possible to provide a computer centre according to the present invention intended for 100% recirculation and mechanical cooling with air inlets and outlets all the same. In that case the computer room can be cooled by means of natural ventilation in case of a breakdown of the climate control system. Thus it is possible, depending on the local external climate, to save on the mechanical emergency climate control system that must be provided in a computer centre with 100% recirculation, where a high degree of operational reliability is required.

In a system with 100% recirculation, the air is not discharged to the outside via the windows 5. After all, the windows 5, if present, are closed. Instead, fans 19 suck the air down from the top of the computer room 1 through the air channels 16 between the side walls 2 and the inner walls 12. Upon flowing downwards, the air passes the coolers 17, where the air is cooled to the required temperature.

If the computer centre is only cooled by 100% recirculation, using mechanical cooling, the windows may be configured as permanently closed windows, of course. Depending on the working conditions, it is also possible not to dispose filters in the air flow, so that the resistance that the air flow will encounter will further decrease.

In the foregoing two extreme forms of cooling computer equipment in a computer centre according to the present invention have been described. It is of course also possible to use various mixed forms, with the cooling method alternately being based on natural ventilation or mechanical ventilation. According to another possibility, cooling can take place partially on the basis of natural ventilation and partially on the basis of mechanical cooling (whether or not with recirculation) at a given moment when the outside air is too dry or too hot. If the outside air is too cold, the air may be mixed with a recirculation flow.

As already discussed in the foregoing, elements required for one of the two extreme forms (for example air inlets and outlets in the case of natural ventilation) may be left out when using the device that is operated in a different manner (in this example 100% recirculation), depending on specific requirements or limitations imposed by the circumstances. The invention is based on the perception that energy can be saved by preventing or reducing the resistance encountered by the air flow.

The air flows described herein are main flows. The dynamics of air, when analysed in detail, are much more complex than described in this document. However, the description of the main flows suffices for explaining the operation of the computer centre.

It will be understood that many variants of a computer room, which may or may not be obvious to those skilled in the art, are possible within the scope of the present invention, which is defined in the appended claims. Thus, the building may be rectangular or spherical instead of having the shape of a truncated pyramid, or the walls may continue in the form of a gable roof. The computer room does not need to have a square base, it may also have a triangular or a pentagonal, hexagonal, heptagonal, octagonal or polygonal base. The elements through which daylight can enter the building may also be located on the south side, but that may lead to a higher internal temperature, due to incident sunlight. It is noted, perhaps unnecessarily, that when the term "100% natural ventilation" is used herein, the fact that internal fans are present in the computer equipment is ignored. In the present document, the presence of said fans is considered to be an unchangeable fact.

What is claimed is:

1. A computer room with a top and bottom and surrounded by a lower floor, at least one side wall and a roof, further comprising a load-bearing floor that is air-permeating over a majority of an area of the load bearing floor, the load-bearing floor disposed above the lower floor, on which load-bearing floor, in use, computer equipment is disposed, wherein a riser channel is formed inside the at least one side wall for hot air above the computer equipment and a return channel is defined for carrying air back from the top of the riser channel to a space under the load-bearing floor, with a surface area of the return channel of a horizontal cross-section of the computer room amounting to at least 5% of a surface area of the riser channel of a corresponding horizontal cross-section, so that air under the load-bearing floor passes upwardly through the load-bearing floor and into the riser channel through natural draft and moves from the bottom of the riser channel to the top of the riser channel and into the return channel through which air at the top of the riser channel is delivered to the space under the load-bearing floor.

2. The computer room according to claim 1, characterised in that at least one air inlet and at least one air outlet are provided in communication with the return channel.

3. The computer room according to claim 1, characterised in that the surface area of the return channel amounts to at least 10% of the surface area of the riser channel.

4. The computer room according to claim 1, characterised in that a source of cooling is provided at an inner wall for cooling circulating air.

5. The computer room according to claim 1, characterised in that at least one inner wall resides inside the at least one side wall and bounds the return channel in conjunction with the at least one side wall and spacing between the at least one inner wall and the at least one side wall decreases in a direction from the top towards the bottom.

6. A computer room according to claim 5, characterized in that the at least one inner wall extends upwards at an angle to vertical.

7. The computer room according to claim 6 characterised in that the at least one side wall extends upwards at an angle to vertical.

8. The computer room according to claim 7 wherein the angle to vertical of the at least one inner wall is different than the angle to vertical of the at least one side wall, thereby producing a decreasing horizontal surface area of the riser channel in a direction from top to bottom.

9. The computer room according to claim 1, characterised in that the horizontal cross-sectional surface area between the at least one inner wall and the at least one side wall is constant over at least a portion of a height of the computer room.

10. The computer room according to claim 1, characterised in that the air resistance of the load-bearing floor is less than 3 Pa.

11. The computer room according to claim 1, characterised in that the load-bearing floor is a grid floor.

12. The computer room according to claim 1, characterised in that the load-bearing floor is disposed at least 0.60 m above the lower floor.

13. The computer room according to claim 12, characterised in that the load-bearing floor is disposed at least 1.80 m above the lower floor.

14. The computer room according to claim 1, characterised in that a further load-bearing floor for computer equipment is provided at a higher level than the load-bearing floor so that heat generating computer equipment operating on the further load-bearing floor further heats air rising in the riser channel to induce upward movement of the air in the riser channel.

15. The computer room according to claim 1, characterised in that said at least one side wall extends upwards at an angle to the vertical.

16. The computer room according to claim 15, characterised in that three or more side walls are provided, which side walls extend upward in a converging manner from a base.

17. The computer room according to claim 1, characterised in that the roof of the computer room is disposed at least 8 m above an air inlet.

18. The computer room according to claim 1, characterised in that a source of cooling is provided for the air.

19. The computer room according to claim 1, characterised in that one or more filters are provided for filtering air.

20. The computer room claim 1, characterised in that structure is provided for recovering and storing energy from air heated by computer equipment on the load-bearing floor.

21. The computer room according to claim 1 in combination with computer equipment on the load-bearing floor that has cooling structure to draw air rising from the space under the load-bearing floor into heat exchange relationship with the computer equipment from where the air heated by the computer equipment rises in the riser channel.

22. The computer room according to claim 21 characterised in that a ceiling is provided below the roof and adjacent to the computer equipment that is located to block upward flow of air from the space under the load-bearing floor tending to flow adjacent and past the computer equipment without moving into heat exchange relationship with the computer equipment.

23. The computer room according to claim 1 characterised in that there is an inlet to the space under the load-bearing floor at the bottom of the computer room for introducing cooling air from outside of the computer room.

24. The computer room according to claim 23 characterised in that there is an outlet on the outer wall for discharging heated air from the top of the riser channel to outside of the computer room.

25. A computer centre comprising two or more separated computer rooms according to claim 1.

\* \* \* \* \*